United States Patent
Lai et al.

(10) Patent No.: US 8,022,382 B2
(45) Date of Patent: Sep. 20, 2011

(54) PHASE CHANGE MEMORY DEVICES WITH REDUCED PROGRAMMING CURRENT

(75) Inventors: Li-Shyue Lai, Jhube (TW); Denny Duan-lee Tang, Saratoga, CA (US); Wen-chin Lin, Hsin-Chu (TW); Teng-Chien Yu, Hsin-Chu (TW); Hui-Fang Tsai, Kaohsiung (TW); Wei-Hsiang Wang, Hsin-Chu (TW); Shyhyeu Wang, Jongli (TW)

(73) Assignees: Taiwan Semiconductor Manufacturing Company, Ltd., Hsin-Chu (TW); Ritek Corporation, Hsin-Chu (TW)

( * ) Notice: Subject to any disclaimer, the term of this patent is extended or adjusted under 35 U.S.C. 154(b) by 1147 days.

(21) Appl. No.: 11/368,192

(22) Filed: Mar. 3, 2006

(65) Prior Publication Data
US 2007/0075347 A1 Apr. 5, 2007

Related U.S. Application Data

(60) Provisional application No. 60/660,794, filed on Mar. 11, 2005.

(51) Int. Cl.
*H01L 29/04* (2006.01)
*H01L 47/00* (2006.01)

(52) U.S. Cl. .................... 257/3; 257/4; 257/40

(58) Field of Classification Search ............ 257/3, 4, 257/40
See application file for complete search history.

(56) References Cited

U.S. PATENT DOCUMENTS

| | | | |
|---|---|---|---|
| 5,296,716 A | 3/1994 | Ovshinsky et al. | |
| 5,789,758 A | 8/1998 | Reinberg | |
| 6,512,241 B1 | 1/2003 | Lai | |
| 6,566,700 B2 | 5/2003 | Xu | |
| 6,569,705 B2 | 5/2003 | Chiang et al. | |
| 6,586,761 B2 | 7/2003 | Lowrey | |
| 6,597,009 B2 * | 7/2003 | Wicker | 257/4 |
| 6,747,286 B2 * | 6/2004 | Lowrey | 257/3 |
| 6,815,705 B2 * | 11/2004 | Klersy et al. | 257/3 |
| 7,323,734 B2 * | 1/2008 | Ha et al. | 257/296 |
| 2001/0034078 A1 * | 10/2001 | Zahorik et al. | 438/95 |

OTHER PUBLICATIONS

Hwang, Y.N., et al., "Writing Current Reduction for High-Density Phase-Change RAM," IEDM, IEEE, 2003, pp. 893-896.
Kang, D.-H., et al., "One-Dimensional Heat Conduction Model for an Electrical Phase Change Random Access Memory Device with an $8F^2$ Memory Cell ($F=0.15$ μm)," Journal of Applied Physics, vol. 94, No. 5, Sep. 1, 2003, pp. 3536-3542.

* cited by examiner

*Primary Examiner* — Ken A Parker
*Assistant Examiner* — Anthony Ho
(74) *Attorney, Agent, or Firm* — Slater & Matsil, L.L.P.

(57) ABSTRACT

A phase change memory device and a method of forming the same are provided. The phase change memory device includes a conducting electrode in a dielectric layer, a bottom electrode over the conducting electrode, a phase change layer over the bottom electrode, and a top electrode over the phase change layer. The phase change memory device may further include a heat sink layer between the phase change layer and the top electrode. The resistivities of the bottom electrode and the top electrode are preferably greater than the resistivity of the phase change material in the crystalline state.

19 Claims, 7 Drawing Sheets

PHASE CHANGE MEMORY DEVICES WITH REDUCED PROGRAMMING CURRENT

This application claims priority to provisional patent application Ser. No. 60/660,794, filed Mar. 11, 2005, entitled "Phase Change Memory with Reduced Programming Circuit," which application is incorporated herein by reference.

TECHNICAL FIELD

This invention relates generally to phase change memory devices, and more particularly to the structures and manufacturing methods of phase change memory devices having reduced programming current.

BACKGROUND

Phase change technology is promising for next generation memory devices. It uses chalcogenide semiconductors for storing states and digital information. The chalcogenide semiconductors, also called phase change materials, have a crystalline state and an amorphous state. In the crystalline state, the phase change materials have low resistivity; while in the amorphous state, they have high resistivity. The resistivity ratios of the phase change material in the amorphous and crystalline states are typically greater than 1000, and thus the phase change memory devices are unlikely to have errors for reading states. The chalcogenide semiconductors are stable at a certain temperature range in both crystalline and amorphous states and can be switched back and forth between the two states by electric pulses. Because of the large resistivity ratio of the crystalline and amorphous states of the phase change material, the resistivities of intermediate states between crystalline and amorphous can also show good enough resolution for multilevel recording. The multilevel recording is another advantage of phase change memory.

Typically, a phase change memory device is formed by placing a phase change material between two electrodes. Write operations, also called programming operations, which apply electric pulses to the memory device, and read operations, which measure the resistance of the phase change memory, are performed through the two electrodes. FIG. 1 illustrates required temperatures for typical programming operations. The temperatures are illustrated as a function of time. A set operation that crystallizes the phase change material is illustrated as line 4. The set pulse needs to heat up the phase change material to a temperature higher than a crystallization temperature $T_x$, but below a melting temperature $T_m$, for a time $t_2$ longer than the required crystalline time, for the crystallization to take place. A reset operation that turns the phase change material into an amorphous state is illustrated by line 2. The reset pulse needs to heat up the phase change material to a temperature higher than the melting temperature $T_m$. The temperature is then quickly dropped below the crystallization temperature $T_x$ during a time period $t_1$, which must be short enough to avoid the crystallization from occurring.

One of the significant challenges that the phase change memory devices face is to reduce the programming current. A commonly used technique for reducing the programming current is to reduce the contact area of the electrical conducting path through the memory device. FIG. 2 illustrates a conventional phase change memory device having reduced contact area. A trench 10 is formed in an insulator 12. A conductive interfacial layer 14 is formed covering the trench 10 and insulator 12. Spacers 16 are formed in trench 10. Phase change material is then deposited into the remainder of the trench to form a phase change layer 18. Since the contact area 17 between the phase change material layer 18 and the interfacial layer is reduced by the spacers 16, the effective resistance is increased and the required programming current is reduced.

Another challenge is to improve the reset speed, which involves quickly dissipating the heat. Typically, the reset speed depends mainly on the intrinsic property of the phase change materials.

FIG. 3 illustrates a prior art phase change memory device having an edge contact. Phase change material layer 26 has a contact region 24 with the edge of a conductive line 20. Since it is easy to form a thin conductive line 20, the contact region 24 can have an area as small 0.004 μm². Therefore, the required current density is significantly reduced.

The prior art solutions suffer some drawbacks, however. The memory device of the prior art may have an undesirable high current density at an interface area, causing alloying of a phase change material and its neighboring material. It is harder to control programming current density in a manageable range when the contact area is very small, hence the control is inaccurate. Inaccurately controlled current density may cause instability of state change in the reset operation. Therefore, there is a need for alternative solutions.

SUMMARY OF THE INVENTION

In accordance with one aspect of the present invention, a phase change memory device includes a conducting electrode in a dielectric layer, a bottom electrode over the conducting electrode, a phase change layer over the bottom electrode, and a top electrode over the phase change layer. Resistivities of the bottom electrode and the top electrode are greater than a resistivity of the phase change layer in a crystalline state.

In accordance with another aspect of the present invention, a phase change memory device includes a conducting electrode in a dielectric layer, wherein the conducting electrode has a top surface, an insulation layer over the dielectric layer, an opening in the insulation layer wherein the opening is above the conducting electrode and has an area greater than an area of the top surface of the conducting electrode, and stacked layers filled in the opening. The stacked layers include a bottom electrode over the conducting electrode and the dielectric layer, a phase change layer over the bottom electrode, a heat sink layer over the bottom electrode, and a top electrode over the phase change layer. The conducting electrode has a top interface having a first area, and the bottom electrode has a top interface having a second area in contact with the phase change layer. The second area and the first area preferably have a ratio of greater than one.

The preferred embodiment has several advantageous features. First, higher resistivity of the bottom electrode and top electrode help the concentration of the current and reduce the required programming current. Also, fewer errors occur due to reduced current density. Second, a higher ratio of the area of the bottom electrode to the top surface area of the conducting electrode reduces alloying of the bottom electrode with the phase change material. Third, the combination of lift-off technique and stacked layer design in some embodiments reduces the number of masks required for forming the phase change memory device.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing a novel phase change memory device embodiment of the present invention are illustrated in FIGS. 4 through 7. Throughout the various views and illustrative embodiments of the present invention, like reference numbers are used to designate like elements.

Figure 1:
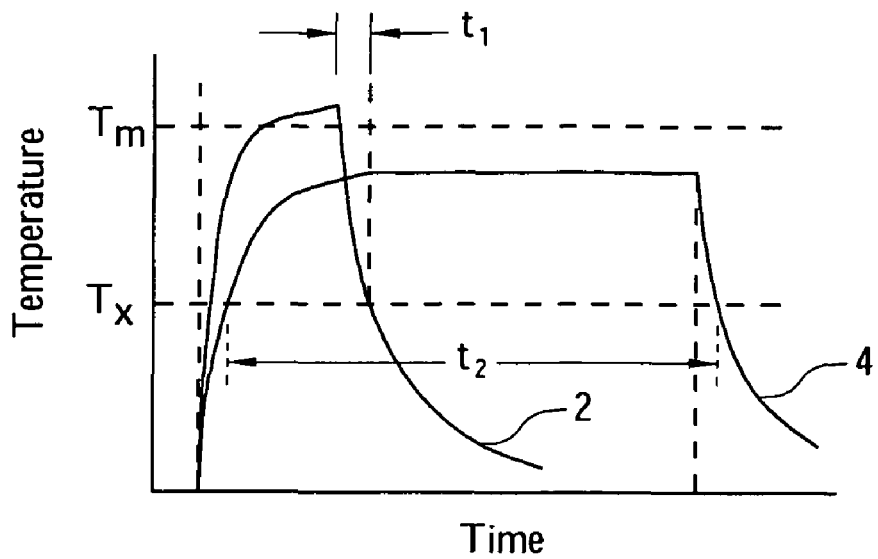
FIG. 1 illustrates required temperatures for programming phase change devices as a function of time.
Figure 2:
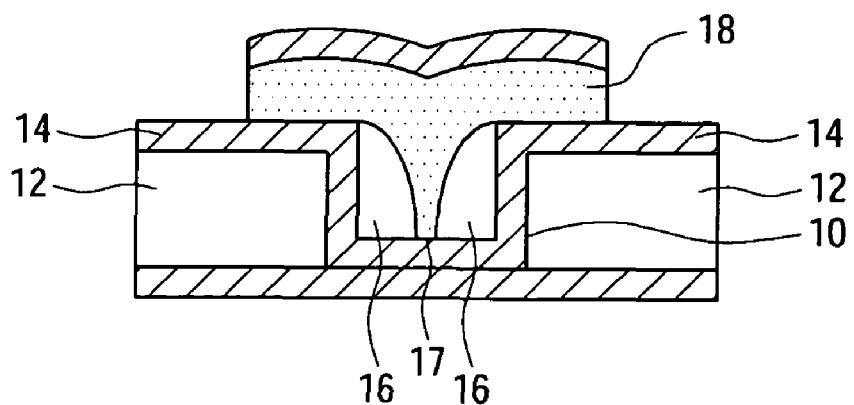
FIG. 2 illustrates a conventional phase change memory device having a reduced contact area.
Figure 3:
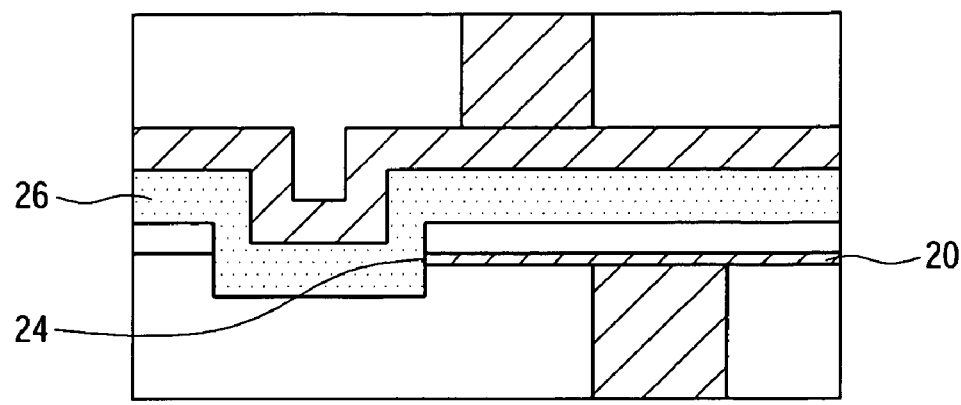
FIG. 3 illustrates a conventional phase change memory device having an edge contact.
Figure 4:
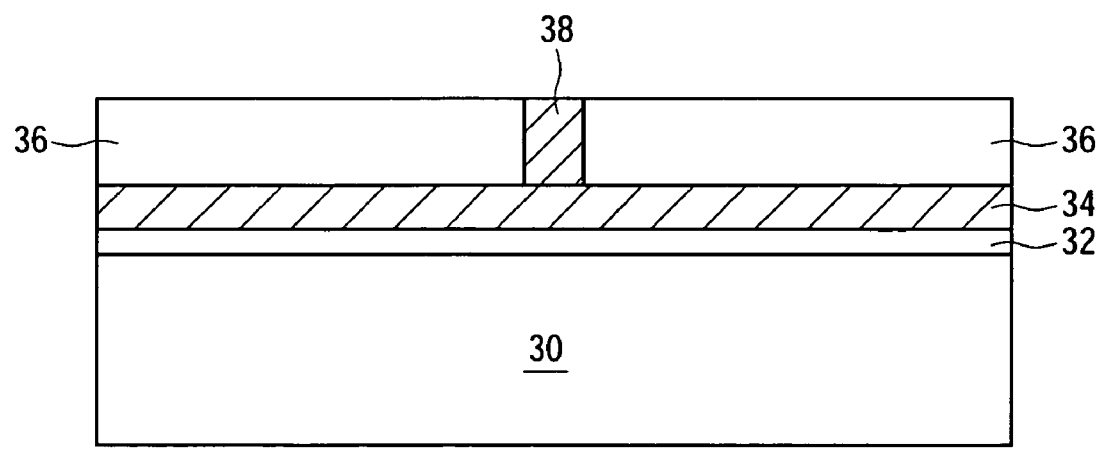
FIGS. 4 through 7b are cross-sectional views of intermediate stages in the manufacture of preferred phase change memory device embodiments.

FIG. 4 illustrates a composite structure. An insulation layer 32 is formed over a substrate 30 and electrically insulates the memory structures that will be subsequently formed. Substrate 30 may be a silicon substrate or a substrate comprising other semiconductor materials. The insulation layer 32 may comprise oxide such as silicon oxide, silicon nitride, or other dielectric materials. A bottom metal line 34 is formed on the insulation layer 32. In the preferred embodiment, the bottom metal line 34 is formed of copper or copper alloys, preferably by a damascene process. In other embodiments, the bottom metal line 34 can be formed of conductive materials such as aluminum, tungsten, etc.

A conducting electrode 38 is then formed. In the preferred embodiment, the conducting electrode 38 is formed by depositing a dielectric layer 36 on metal line 34, forming an opening in dielectric layer 36, and then filling the opening with conductive materials. Conducting electrode 38 is preferably formed of conductive materials such as W, Al, Cu, AlTi, AlCu and the like, and preferably has a resistivity of lower than about $10^{-5}\Omega\cdot cm$.

Figure 5A:
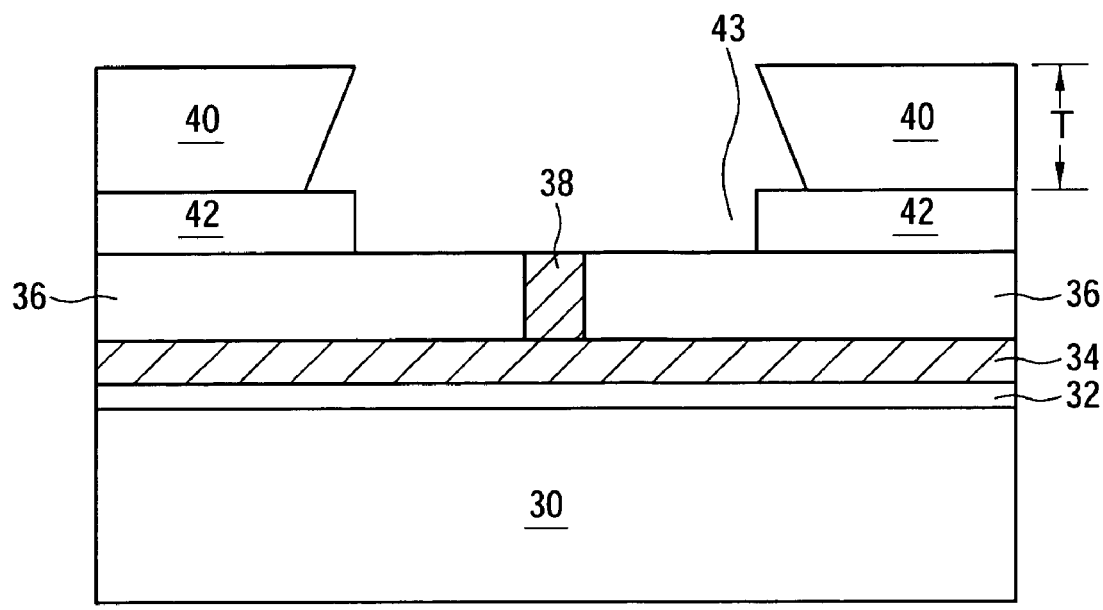

In the preferred embodiment, a portion of the phase change memory device is thermally insulated from the dielectric layer 36 by insulation-defining regions 42, which are preferably formed of a dielectric material or air. The formation of the insulation-defining regions 42 is illustrated in FIG. 5a. In the preferred embodiment, insulation-defining regions 42 comprise a commonly used dielectric material such as silicon oxide, silicon nitride, and combinations thereof. The insulation-defining regions 42 have an opening 43 exposing the conducting electrode 38 and a portion of the dielectric layer 36.

A stencil layer 40 is formed surrounding an area where a memory device is to be formed. The stencil layer 40 may be formed of materials such as a photo resist, a composite layer including a polyimide and a molybdenum layer, or a composite layer including an inorganic dielectric layer and a photo resist, etc. In the preferred embodiment, stencil layer 40 comprises photo resist. Stencil layer 40 is subsequently removed, also referred to as lifting off, preferably by using acetone. Accordingly, the desired thickness T of stencil layer 40 is preferably greater than the total thickness of a subsequently formed stacked structure. One advantageous feature of using the lift off technique is that fewer masks are required. In other embodiments, instead of using the lift off technique, photolithography can be used to define the outer boundaries of the memory device.

Figure 6A:
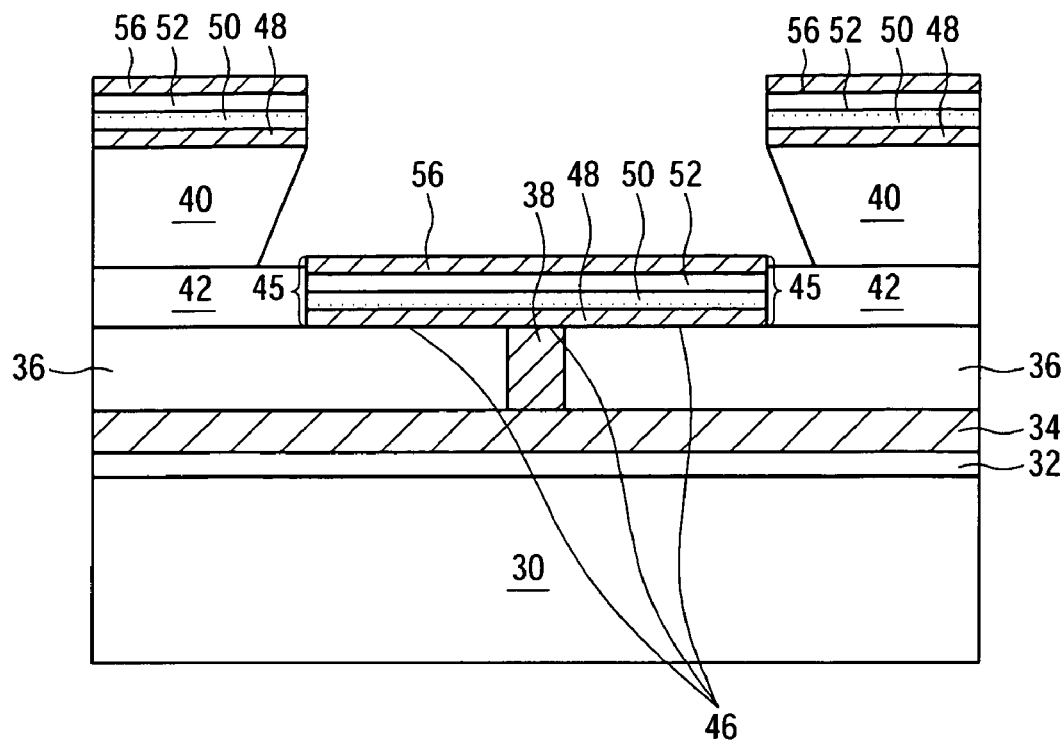
Figure 6B:
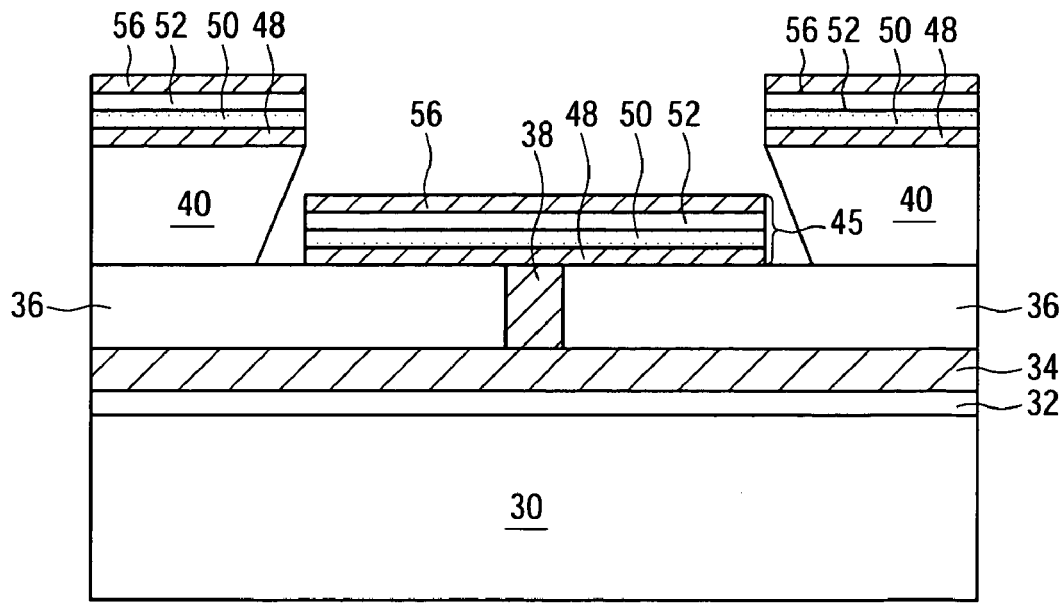

The main part of the memory cell is formed as stacked layers 45, as is shown in FIG. 6a. The stacked layers 45 comprise a bottom electrode 48, a phase change layer 50, a heat sink layer 52, and a top electrode 56. In the preferred embodiment, all these layers are formed sequentially in a multiple-chamber physical vapor deposition (PVD) system. In other embodiments, low temperature sputtering can be used to form the stacked layers 45.

To form the stacked layers 45, a bottom electrode 48, also referred to as a heating electrode, is first formed over the previously formed composite structure. In the preferred embodiment, bottom electrode 48 comprises TiAlN. In alternative embodiments, TiN, carbon-containing materials, and crystalline materials can be used. In yet other embodiments, bottom electrode 48 may include more than one layer. The bottom electrode 48 should have good adhesion to contacting electrode 38 and dielectric layer 36, so that when lift off is performed, no peeling occurs between bottom electrode 48 and the underlying layer(s). The preferred thickness of bottom electrode 48 is between about 1 nm and about 50 nm, and more preferably between about 10 nm and about 20 nm.

A phase change layer 50, also sometimes referred to as a chalcogenide material layer, is formed over the bottom electrode 48. Phase change layer 50 comprises chalcogenide materials, preferably $Ge_xSb_yTe_z$, wherein x, y and z indicate the ratio of the respective numbers. In an exemplary embodiment, x is about 2, y is about 2, and z is about 5. Phase change layer 50 preferably has a thickness of between about 10 nm and about 100 nm, and more preferably between about 40 nm and about 80 nm. The ratio of amorphous resistivity and crystalline resistivity of phase change layer 50 can be as high as 5 orders, although the ratio may be lower. In an exemplary embodiment, the resistivity of amorphous phase change layer 50 is between about $1\Omega\cdot cm$ and about $1E2\Omega\cdot cm$, and the resistivity of the same material in the crystalline state is between about $1E-5\Omega\cdot cm$ and about $5E-3\Omega\cdot cm$. In alternative embodiments, phase change materials that can be symbolized as $Ge_xSb_yTe_zM$ are used, wherein M is a material selected from Ag, Sn, In, and combinations thereof.

Bottom electrode 48 preferably has an electrical resistivity at least comparable to, and more preferably higher than, the resistivity of phase change layer 50 in the crystalline state. The electrical resistivity of the bottom electrode is preferably higher than $5E-3\Omega\cdot cm$. Also, the resistivity of the bottom electrode 48 is preferably one order, and more preferably two orders higher than the resistivity of conducting electrode 38, so that the bottom electrode 48 acts as a heating electrode while significantly less heat is generated in the conducting electrode 38. In an embodiment wherein bottom electrode 48 comprises TiAlN formed of physical layer deposition, the resistivity of the bottom electrode 48 may be adjusted by changing the nitrogen-to-argon ratio. A greater nitrogen concentration will result in an increase in the resistivity. The bottom electrode 48 is in contact with the conducting electrode 38 and dielectric layer 36 through an interface 46 having an area of $A_1$. Preferably, $A_1$ is greater than a top surface area $A_p$ of the conducting electrode 38. More preferably, $A_1$ and $A_p$ have a ratio of greater than about 1, and even more preferably greater than about 5. Great contact area between bottom electrode 48 and phase change layer 50 helps reduce alloying of the phase change material 50 and the bottom electrode 48. Preferably, bottom electrode 48 has a substantially close top surface area and bottom surface area.

A heat sink layer 52 is then formed over the phase change layer 50. In a reset process, the heat in phase change layer 50 can be dissipated into the heat sink layer 52 and thus the temperature of the phase change material can be rapidly decreased. It preferably has a high thermal conductivity and a low electrical conductivity. The heat sink layer 52 preferably comprises metal nitride, metal compound, and combinations thereof. In the preferred embodiment, the heat sink layer 52 is formed of TiAl. In other embodiments, additional materials such as Ti, TiW, TiN and their combinations can also be used. Heat sink layer 52 has a preferred thickness of between about 1 nm and about 80 nm, and more preferably about 20 nm.

The addition of heat sink layer 52 provides additional control of heating by controlling the heat conducting through it from the subsequently formed top electrode during heating. If less heating is desired, the thickness of heat sink layer 52 can be increased. The same effect can be achieved by decreasing the thermal conductivity of heat sink layer 52.

A top electrode 56 is formed over the heat sink layer 52. It has a preferred thickness of between about 1 nm and about 50 nm, and more preferably between about 10 nm and about 20 nm. Top electrode 56 preferably comprises similar materials as in bottom electrode 48, and thus has a resistivity similar to the bottom electrode 48, although they can have different materials. In the preferred embodiment, the resistivity is greater than about $1E-3\Omega\cdot cm$, and more preferably greater than about $5E-3\Omega\cdot cm$. In the preferred embodiment, top electrode 56 comprises TiAlN. In other embodiments, TiN and other materials comprising carbon and silicon can also be used.

Figure 7A:
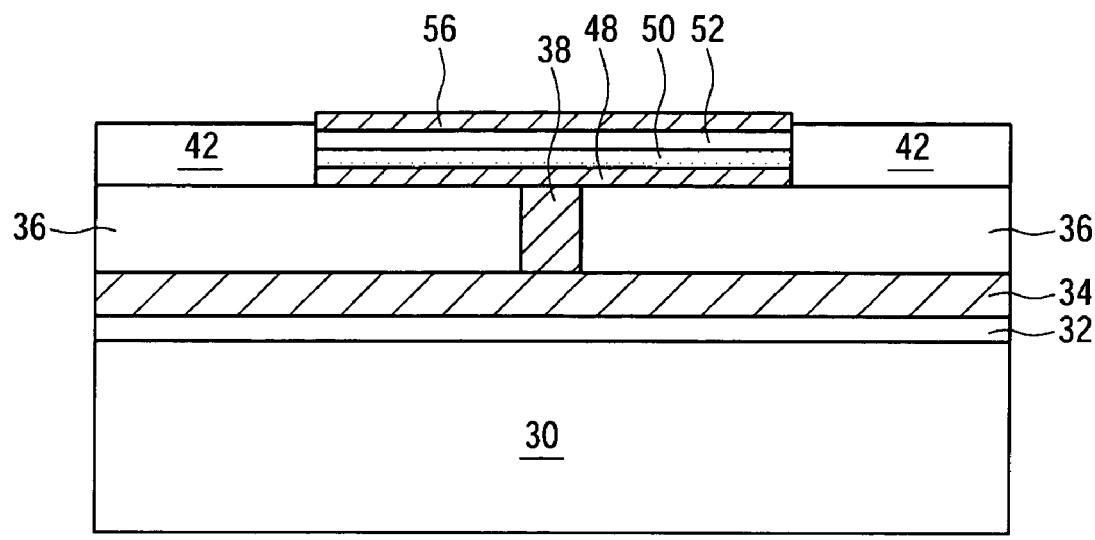

Preferably, bottom electrode 48, phase change layer 50, heat sink layer 52 and electrode 56 are blanket formed and patterned. Since the patterns of bottom electrode 48, phase change layer 50, heat sink layer 52 and top electrode 56 are defined by the same stencil layer 40, the respective edges of bottom electrode 48, phase change layer 50, heat sink layer 52 and top electrode 56 are substantially vertically aligned and are co-terminus. FIG. 7a illustrates a structure after the removal of the stencil layer 40, preferably by using acetone solution. The stacked layers that are formed over stencil layer 40 are lifted off.

Figure 5B:
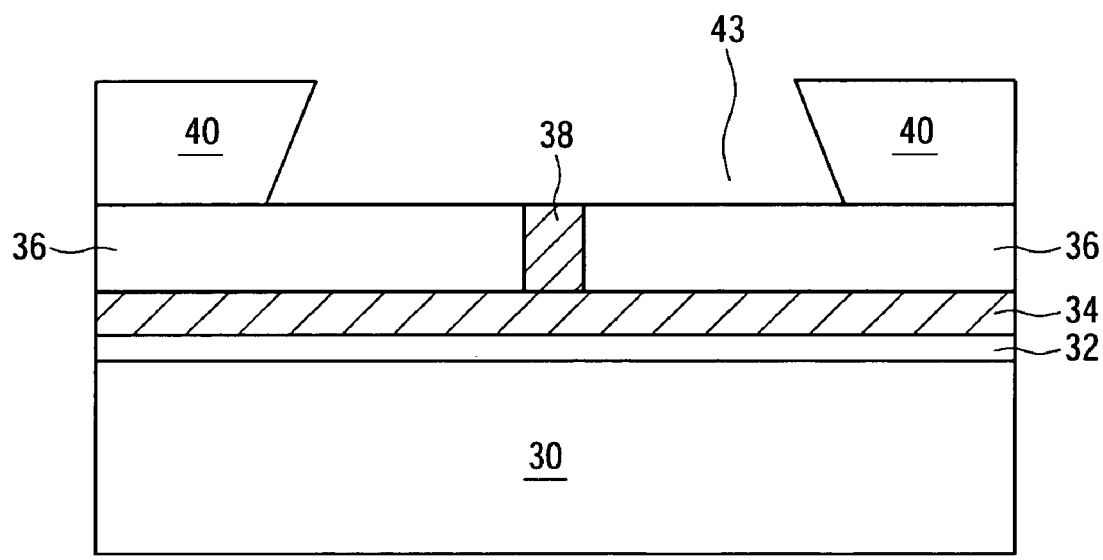
Figure 7B:
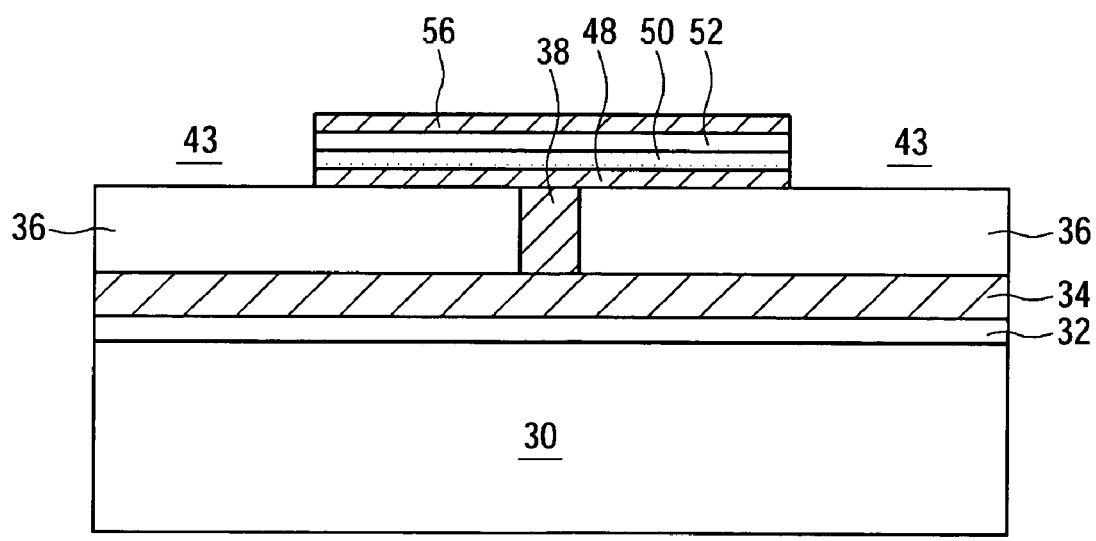

FIGS. 5b through 7b illustrate another preferred embodiment. In FIG. 5b, a stencil layer 40, preferably formed of photo resist, is formed over dielectric layer 36. Stencil layer 40 has an opening 43 exposing the conducting electrode 38. In FIG. 6b, stacked layers 45 are formed in the opening 43 and on the stencil layer 40. The details of the stacked layers 45 have been described in the previously discussed embodiment, thus are not repeated herein. Stencil layer 40 is preferably substantially thicker than stacked layers 45, so that a portion of the stacked layers 45 on stencil layer 40 is separated from the portions not on the stencil layer 40. The stencil layer 40 is then removed, preferably after an overlying layer is formed, and the resulting structure is shown in FIG. 7b. The removal of the stencil layer 40 causes the formation of cavities 43, which can remain in the final structure after an inter-layer dielectric (ILD) layer is formed. Therefore, an air insulator is formed. Since air has a thermal conductivity of only one tenth of the thermal conductivity of the conventional insulation materials such as oxide or nitride, it is an ideal thermal insulator for thermal confinement.

The design of stacked layers 45 has taken into account the factor of balancing joule's heat generation and heat dissipation during the reset process. During a set process, when the phase change material in phase change layer 50 is in an amorphous state, heat generation in the stacked layers 45 mainly occurs in phase change layer 50 due to the higher resistivity of amorphous phase change material. A rapid set process requiring low current is thus achieved. During a reset process, when the phase change material is still in a crystalline state, due to the high resistivity of the bottom and top electrodes, heat generation mainly occurs in the bottom and top electrodes due to their higher resistivities compared to the phase change material in the crystalline state. In the conventional design provided by most of the other studies, the resistivity of the bottom and top electrodes are lower than the phase change material in the crystalline state, and the heat generation during a reset process occurs in the phase change layer. It is understandable that due to higher combined resistance (of top electrode, bottom electrode and phase change layer), more heat can be generated by the preferred embodiment of the present invention than in the conventional design. As a result, the present invention provides a low reset current density, and a rapid reset process is achieved.

During the reset process, quickly heating the crystalline phase change material to a melting state is important. In addition, quickly quenching the temperature of the molten phase change material to prevent crystallization from occurring during the reset process is also crucial. Heat sink layer 52 is thus added to balance the heating effect and the fast quenching effect. The heat sink layer 52, due to its low resistivity, generates less heat during the reset process than the phase change layer 50. It thus helps control the heating of the phase change material by the top electrode during the reset process, which, as has been discussed in the preceding paragraphs, can be achieved by adjusting the thickness and/or thermal conductivity of heat sink layer 52. It also helps in dissipating the heat when the reset current is stopped when fast quenching is needed.

By balancing the heating power and the quenching ability of bottom electrode 48, phase change layer 50, heat sink layer 52, and top electrode 56, phase change memory devices with very low reset current density can be obtained. Reset current density can be further lowered by finely adjusting the thicknesses of these layers.

The preferred embodiments of the present invention have been tested for more than $10^6$ set-reset cycles, during which a pulse generator is used. The pulse generator has the capability of generating voltage pulses with widths of from 5 ns to 300 ns and amplitudes of from 0.5V to 5V. The results have shown that with proper materials and design, the programming current density can be significantly reduced.

The tested samples include samples 1 and 2, which were made according to the structure of the present invention. In sample 1 prepared by lift off process, the phase change layer comprises GeSbTeSn, while the bottom and top electrodes comprise TiAlN. The material of the heat sink layer is TiAl. The crystalline phase change layer has a resistivity of about $8E-5\Omega\cdot cm$, while the resistivities of the bottom and top electrode are about $1.4E-2\Omega\cdot cm$. The thicknesses of the bottom electrode 48, phase change layer 50, heat sink layer 52 and top electrode 56 are 100 nm, 400 nm, 200 nm and 100 nm, respectively. The diameter of the contact area between phase change layer and bottom electrode is about 60 µm. The diameter of the top surface of the contacting electrodes 38 is about 0.26 µm.

A wet etching process is used to prepare a sample 2, which is similar to sample 1, except that some dimensions are different. In sample 2, the thicknesses of the bottom electrode 48, phase change layer 50, heat sink layer 52 and top electrode 56 are 200 nm, 800 nm, 200 nm, and 200 nm, respectively. The diameter of the contact area between phase change layer 50 and bottom electrode 48 is about 3 μm. The diameter of the top surface of the contacting electrode 38 is also about 0.26 μm. The resistivities of the bottom and top electrodes are about 1E-2Ω·cm, while the crystalline-state phase change layer, which also comprises GeSbTeSn, is about 8E-5Ω·cm.

Table 1 is provided to show a comparison between reset current densities obtained from samples 1 and 2 and those from the prior art, wherein "current density" is the reset current (mA) divided by the acting area (um²). "Acting area" is the contact area defined by the top surface area of the contacting electrode in the present invention.

TABLE 1

Sample current densities compared to prior art's results

| Measured Devices | Acting Area (μm²) | Reset Current (μA) | Current Density (μA/μm²) |
|---|---|---|---|
| Intel | 0.0081 | 1 | 123.46 |
| Ovonyx | 0.0144 | 1.3 | 90.28 |
| Samsung | 0.004 | 0.34 | 85.00 |
| Sample 1 | 0.053 | 0.2 | 3.77 |
| Sample 2 | 0.053 | 0.35 | 6.60 |

It is found that samples 1 and 2 can be reset at significantly lower currents and current densities than prior art samples. Sample 1 has a smaller reset current density than sample 2, partially due to the greater ratio of the contact area between the phase change layer and the bottom electrode to the top surface area of the contacting electrode.

Figure 8:
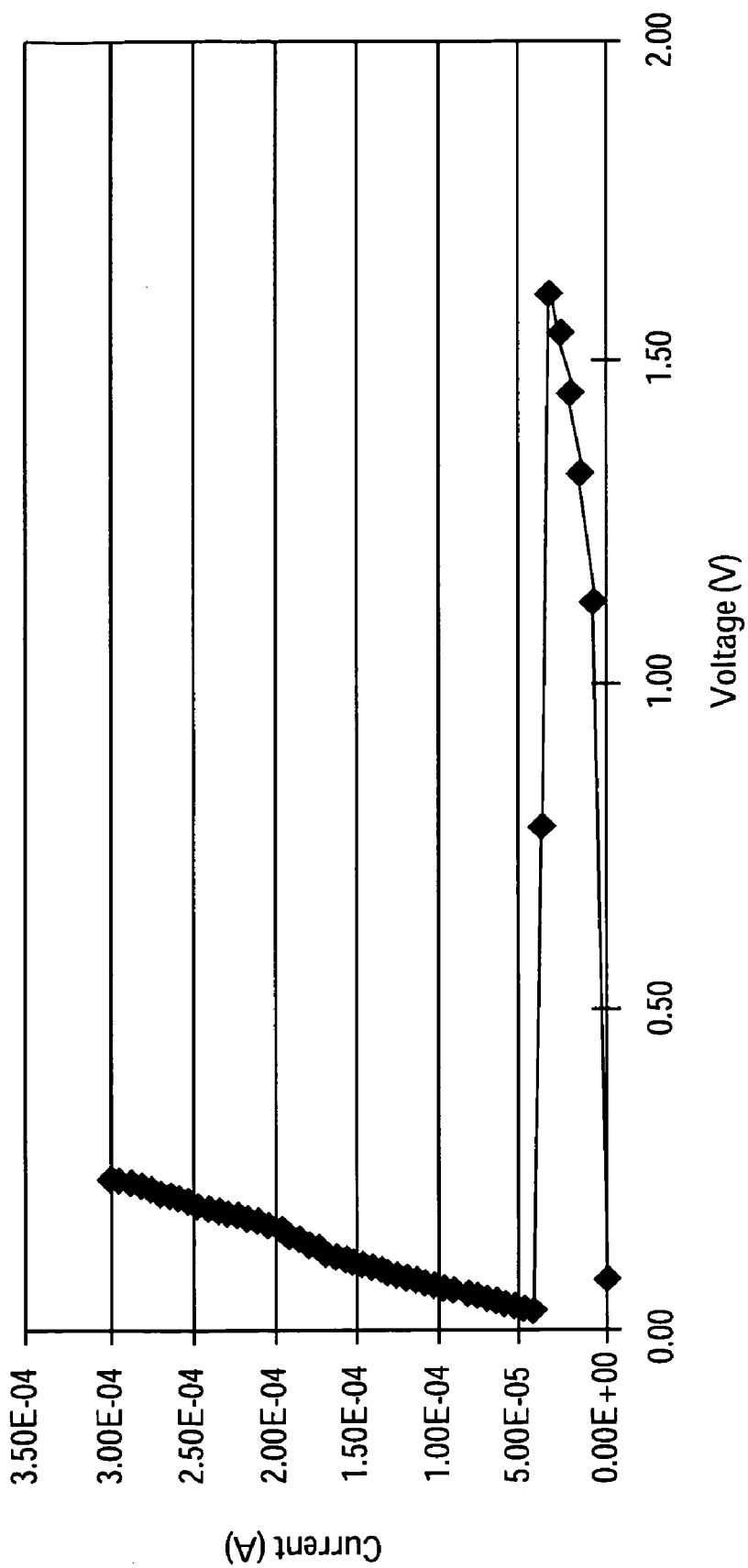
FIGS. 8 and 9 show I-V curves of samples having the preferred structure.
Figure 9:
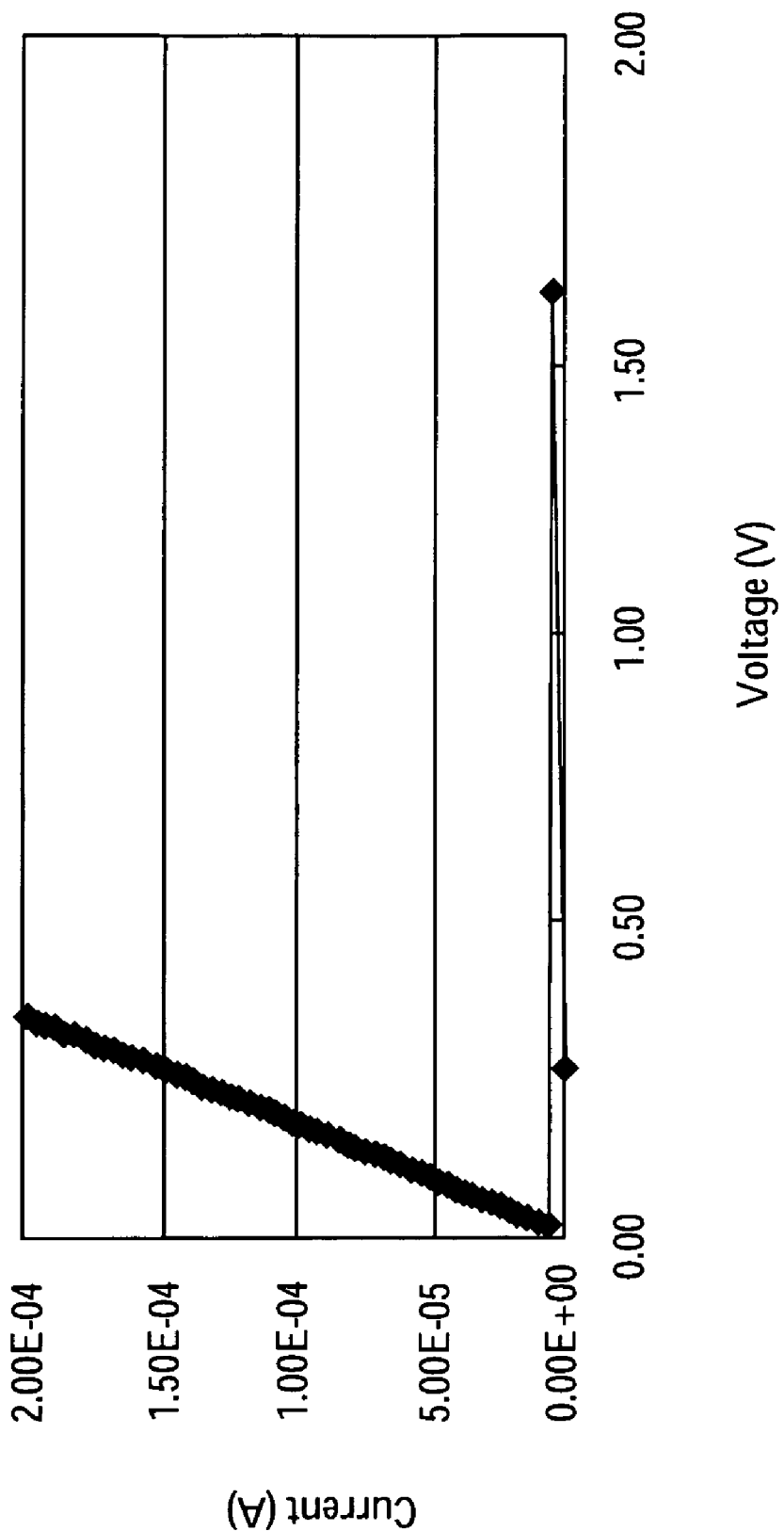

FIGS. 8 and 9 illustrate the I-V curves of samples 1 and 2 for reset operations, from which the reset voltages are obtained. The x-axis indicates the voltages applied on the samples, and the y-axis indicates the currents flowing through the samples.

The preferred embodiments have several advantageous features. Firstly, high resistivities of the bottom electrode and the top electrode help generate more heat, and thus reduce the required reset current. Secondly, with a high ratio of the top surface area of the bottom electrode to the top surface area of the conducting electrode, alloying of the bottom electrode with the phase change material is reduced. Thirdly, the combination of the lift-off technique and the stacked layer structure design reduces the masks required.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A phase change memory device comprising:
a conducting electrode in a dielectric layer;
a bottom electrode over the conducting electrode;
a phase change layer over the bottom electrode, wherein the bottom electrode is substantially co-terminus with the phase change layer, wherein the conducting electrode has a top interface having a first area, and wherein an interface of the bottom electrode and the phase change layer has a second area, and wherein the second area and the first area have a ratio greater than one; and
a top electrode over the phase change layer, wherein resistivities of the bottom electrode and the top electrode are each greater than a resistivity of the phase change layer in a crystalline state, and wherein at least one of the bottom electrode and the top electrode comprises a material selected from the group consisting essentially of TiAlN, carbon, crystalline materials, and combinations thereof.

2. The phase change memory device of claim 1, wherein the ratio of the second area to the first area is greater than about 5.

3. The phase change memory device of claim 1, wherein the bottom electrode has a resistivity of greater than about 5E-3Ω·cm.

4. The phase change memory device of claim 1, wherein the top electrode has a resistivity of greater than about 1E-3Ω·cm.

5. The phase change memory device of claim 1, wherein the bottom electrode comprises TiAlN.

6. The phase change memory device of claim 1, wherein the bottom electrode and the top electrode have thicknesses of between about 1 nm and about 50 nm.

7. The phase change memory device of claim 6, wherein the thicknesses of the bottom electrode and the top electrode are between about 10 nm and about 20 nm.

8. The phase change memory device of claim 1, wherein the phase change layer comprises elements selected from the group consisting essentially of Ge, Te, Ga, Sb, Ag, Sn, In, and combinations thereof.

9. The phase change memory device of claim 1, wherein the phase change layer has a resistivity of between about 1E-5Ω·cm and about 5E-3Ω·cm when in the crystalline state.

10. The phase change memory device of claim 1, wherein the phase change layer has a thickness of between about 10 nm and about 100 nm.

11. The phase change memory device of claim 10, wherein the thickness of the phase change layer is between about 40 nm and about 80 nm.

12. The phase change memory device of claim 1 further comprising a heat sink layer over the phase change layer.

13. The phase change memory device of claim 12, wherein the heat sink layer is a metal compound layer comprising a material selected from the group consisting essentially of Ti, TiAl, TiW, and combinations thereof.

14. The phase change memory device of claim 12, wherein the heat sink layer has a thickness of between about 1 mn and about 80 nm.

15. The phase change memory device of claim 14, wherein the thickness of the heat sink layer is about 20 nm.

16. The phase change memory device of claim 1, wherein the bottom electrode, the phase change layer, and the top electrode are substantially co-terminus.

17. The phase change memory device of claim 1, wherein the bottom electrode comprises the material selected from the group consisting essentially of TiAlN, carbon, crystalline materials, and combinations thereof.

18. The phase change memory device of claim 1, wherein the top electrode comprises the material selected from the group consisting essentially of TiAlN, carbon, crystalline materials, and combinations thereof.

19. The phase change memory device of claim 1, wherein both the top electrode and the bottom electrode comprise the material selected from the group consisting essentially of TiAlN, carbon, crystalline materials, and combinations thereof.

* * * * *

UNITED STATES PATENT AND TRADEMARK OFFICE
CERTIFICATE OF CORRECTION

PATENT NO. : 8,022,382 B2  
APPLICATION NO. : 11/368192  
DATED : September 20, 2011  
INVENTOR(S) : Lai et al.

Page 1 of 1

It is certified that error appears in the above-identified patent and that said Letters Patent is hereby corrected as shown below:

In Col. 8, line 57, claim 14, delete "1 mn" and insert --1 nm--.

Signed and Sealed this  
Twenty-ninth Day of November, 2011

David J. Kappos  
*Director of the United States Patent and Trademark Office*